(12) United States Patent
Kelley et al.

(10) Patent No.: US 7,384,871 B2
(45) Date of Patent: *Jun. 10, 2008

(54) CHEMICAL MECHANICAL POLISHING COMPOSITIONS AND METHODS RELATING THERETO

(75) Inventors: Francis J. Kelley, Bear, DE (US);
John Quanci, Haddonfield, NJ (US);
Joseph K. So, Newark, DE (US);
Hongyu Wang, Wilmington, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 93 days.

This patent is subject to a terminal disclaimer.

(21) Appl. No.: 10/882,567

(22) Filed: Jul. 1, 2004

(65) Prior Publication Data

US 2006/0000150 A1    Jan. 5, 2006

(51) Int. Cl.
*C09G 1/02* (2006.01)
*C09G 1/04* (2006.01)
*H01L 21/304* (2006.01)
*H01L 21/461* (2006.01)

(52) U.S. Cl. .................... 438/692; 51/307; 51/308; 51/309; 106/3; 106/5; 438/693; 216/105; 216/106

(58) Field of Classification Search .............. 51/307, 51/308, 309, 298; 106/3, 5; 438/692, 693; 451/28; 216/105, 106; 510/175, 369, 401, 510/434
See application file for complete search history.

(56) References Cited

U.S. PATENT DOCUMENTS

| | | | |
|---|---|---|---|
| 6,117,775 A | 9/2000 | Kondo et al. | |
| 6,326,299 B1 | 12/2001 | Homma et al. | |
| 6,562,719 B2 | 5/2003 | Kondo et al. | |
| 6,585,568 B2 | 7/2003 | Tsuchiya et al. | |
| 6,605,537 B2 | 8/2003 | Bian et al. | |
| 6,620,037 B2 | 9/2003 | Kaufman et al. | |
| 6,632,259 B2 | 10/2003 | Weinstein et al. | |
| 6,679,928 B2 * | 1/2004 | Costas et al. | 51/307 |
| 2003/0181345 A1 | 9/2003 | Bian | |
| 2003/0219982 A1 | 11/2003 | Kurata et al. | |
| 2004/0023492 A1 | 2/2004 | Bian et al. | |
| 2004/0229461 A1 * | 11/2004 | Darsillo et al. | 438/689 |
| 2005/0104048 A1 * | 5/2005 | Thomas et al. | 252/515 |
| 2005/0136671 A1 * | 6/2005 | Goldberg et al. | 438/691 |

FOREIGN PATENT DOCUMENTS

| | | |
|---|---|---|
| EP | 1 211 717 A1 | 6/2002 |
| EP | 1 223 609 A1 | 7/2002 |
| WO | WO 99/64527 A1 | 12/1999 |
| WO | WO 01/14496 A1 | 3/2001 |
| WO | WO 02/094957 A2 | 11/2002 |

* cited by examiner

*Primary Examiner*—Michael Marcheschi
(74) *Attorney, Agent, or Firm*—Blake T. Biederman

(57) ABSTRACT

The present invention provides an aqueous composition useful for polishing nonferrous metal interconnects on a semiconductor wafer comprising oxidizer, inhibitor for a nonferrous metal, complexing agent for the nonferrous metal, modified cellulose, 0.01 to 5% by weight copolymer of acrylic acid and methacrylic acid, and balance water, wherein the copolymer of acrylic acid and methacrylic acid has a monomer ratio (acrylic acid/methacrylic acid) in the range of 1:30 to 30:1 and the copolymer has a molecular weight in the range of 1K to 1000K.

9 Claims, 1 Drawing Sheet

CHEMICAL MECHANICAL POLISHING COMPOSITIONS AND METHODS RELATING THERETO

BACKGROUND OF THE INVENTION

The invention relates to chemical mechanical planarization (CMP) of semiconductor wafer materials and, more particularly, to CMP compositions and methods for polishing metal interconnects on semiconductor wafers in the presence of dielectrics and barrier materials.

Typically, a semiconductor wafer is a wafer of silicon with a dielectric layer containing multiple trenches arranged to form a pattern for circuit interconnects within the dielectric layer. The pattern arrangements usually have a damascene structure or dual damascene structure. A barrier layer covers the patterned dielectric layer and a metal layer covers the barrier layer. The metal layer has at least sufficient thickness to fill the patterned trenches with metal to form circuit interconnects.

CMP processes often include multiple polishing steps. For example, a first step removes excess interconnect metals, such as copper at an initial high rate. After the first step removal, a second step polishing can remove metal that remains on the barrier layer outside of the metal interconnects. Subsequent polishing removes the barrier from an underlying dielectric layer of a semiconductor wafer to provide a planar polished surface on the dielectric layer and the metal interconnects.

The metal in a trench or trough on the semiconductor substrate provides a metal line forming a metal circuit. One of the problems to be overcome is that the polishing operation tends to remove metal from each trench or trough, causing recessed dishing of such metal. Dishing is undesirable as it causes variations in the critical dimensions of the metal circuit. To reduce dishing, polishing is performed at a lower polishing pressure. However, merely reducing the polishing pressure would require that polishing continue for a lengthened duration. However, dishing would continue to be produced for the entire lengthened duration. What is needed is a method to reduce dishing of metal in trenches or troughs without lengthening the duration of the polishing operation. Polishing compositions that leave a surface clear of interconnect metal residue after a short second step polishing time are needed.

U.S. Pat. No. 6,632,259 describes the use of engineered copolymers in aqueous polishing compositions for CMP. These include copolymers derived from a mixture comprising acrylic acid monomer and methacrylic acid monomer at a mole ratio of acrylic acid monomer to methacrylic acid monomer of about 1:20 to about 20:1. These are disclosed in polishing compositions that do not comprise a modified cellulose.

STATEMENT OF THE INVENTION

In a first aspect, the present invention provides an aqueous composition useful for CMP of a semiconductor wafer containing a metal comprising oxidizer, inhibitor for a nonferrous metal, complexing agent for the nonferrous metal, modified cellulose, 0.01 to 5% by weight copolymer of acrylic acid and methacrylic acid, and balance water, wherein the copolymer of acrylic acid and methacrylic acid has a monomer ratio (acrylic acid/methacrylic acid) in the range of 1:30 to 30:1 and the copolymer has a molecular weight in the range of 1K to 1000K. The polishing composition may optionally contain an abrasive at up to 3 percent by weight.

In a second aspect, the present invention provides a method for CMP of a semiconductor wafer containing a metal comprising, a) contacting the wafer with a polishing composition, the polishing composition comprising oxidizer, inhibitor for a nonferrous metal, complexing agent for the nonferrous metal, modified cellulose, 0.01 to 5% by weight copolymer of acrylic acid and methacrylic acid, and balance water, wherein the copolymer of acrylic acid and methacrylic acid has a monomer ratio (acrylic acid/methacrylic acid) in the range of 1:30 to 30:1 and the copolymer has a molecular weight in the range of 1K to 1000K and b) polishing the wafer with a polishing pad. The polishing composition may optionally contain an abrasive at up to 3 percent by weight.

DETAILED DESCRIPTION

Figure 1:
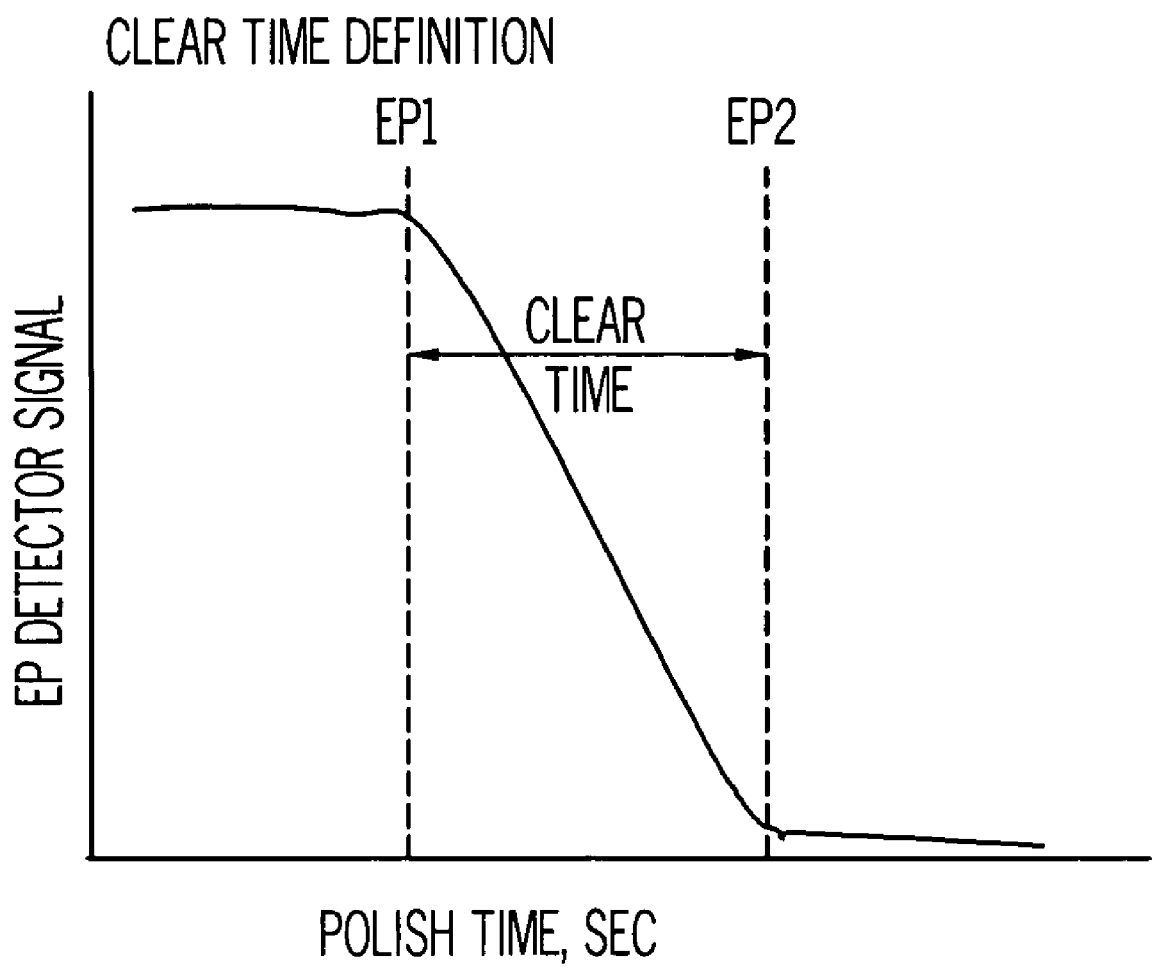
FIG. 1 is a graphical description of clear time.

The composition and method provide good metal removal rates and adequate metal clearing without excessive dishing of the metal interconnects when a semiconductor wafer is exposed to CMP. The composition of the present invention utilizes water soluble copolymers of acrylic acid and methacrylic acid along with water soluble cellulose modified with carboxylic acid functionality. Although the present invention has particular usefulness in copper interconnects, the present aqueous polishing composition also provides enhanced polishing of other nonferrous metal interconnects, such as aluminum, gold, nickel, platinum group metals, silver, tungsten, and alloys thereof.

The copolymer of this invention is synthesized utilizing acrylic acid monomer and methacrylic acid monomer at a mole ratio in a range of 1:30 to 30:1; preferably in a range of 1:9 to 9:1; and most preferably about 2:3. The copolymer of this invention has a molecular weight in the range of 1K to 1000K; preferably in the range of 20K to 200K. For purposes of this specification, molecular weight refers to weight average molecular weight.

The polishing composition of this invention contains water soluble cellulose modified with carboxylic acid functionality. Preferably, the composition contains 0.01 to 5.0 weight percent of water soluble cellulose. Most preferably, the composition contains about 0.3 weight percent of water soluble cellulose. Exemplary modified cellulose are anionic gums such as agar gum, arabic gum, ghatti gum, karaya gum, guar gum, pectin, locust bean gum, tragacanth gums, tamarind gum, carrageenan gum, and xantham gum, modified starch, alginic acid, mannuronic acid, guluronic acid, and their modifications and combinations. The preferred water soluble cellulose, carboxy methyl cellulose (CMC), has a degree of substitution of 0.1 to 3.0 with a molecular weight of 1K to 1000K. More preferred CMC has a degree of substitution of 0.7 to 1.2 with a molecular weight of 40K to 250K. Degree of substitution in CMC is the number of hydroxyl groups on each anhydroglucose unit in the cellulose molecule that is substituted. It can be considered as a measure of the "density" of carboxylic acid groups in the CMC.

Preferably, the solution contains up to 25 weight percent oxidizer. More preferably, the oxidizer is in the range of 5 to 10 weight percent. The oxidizer is particularly effective at assisting the solution in removing copper at low pH ranges. The oxidizing agent can be at least one of a number of oxidizing compounds, such as hydrogen peroxide ($H_2O_2$), monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, copper salts, chromium salts, cobalt salts, halogens, hypochlorites and a mixture thereof. Furthermore, it is often advantageous to use a mixture of oxidizer compounds. When the polishing slurry contains an unstable oxidizing agent such as, hydrogen peroxide, it is often most advantageous to mix the oxidizer into the composition at the point of use.

Further, the solution contains inhibitor to control copper interconnect removal rate by static etch or other removal mechanism. Adjusting the concentration of an inhibitor adjusts the interconnect metal removal rate by protecting the metal from static etch. Preferably, the solution contains 0.05 to 5.0 weight percent inhibitor. Most preferably, the solution contains 0.2 to 1.0 weight percent inhibitor. The inhibitor may consist of a mixture of inhibitors. Azole inhibitors are particularly effective for copper and silver interconnects. Typical azole inhibitors include benzotriazole (BTA), mercaptobenzothiazole (MBT), tolytriazole (TTA) and imidazole. BTA is a particularly effective inhibitor for copper and silver.

In addition to the inhibitor, the composition preferably contains complexing agent for the nonferrous metal. The complexing agent may facilitate the removal rate of the metal film, such as copper. Preferably, the composition contains 0.01 to 15 weight percent complexing agent for the nonferrous metal. Most preferably, the composition contains 0.1 to 1 weight percent complexing agent for the nonferrous metal. Example complexing agents include acetic acid, citric acid, ethyl acetoacetate, glycolic acid, lactic acid, malic acid, oxalic acid, salicylic acid, sodium diethyl dithiocarbamate, succinic acid, tartaric acid, thioglycolic acid, glycine, alanine, aspartic acid, ethylene diamine, trimethyl diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, including salts and mixtures thereof Preferably, the complexing agent is selected from the group consisting of acetic acid, citric acid, ethyl acetoacetate, glycolic acid, lactic acid, malic acid, oxalic acid and mixtures thereof. Most preferably, the complexing agent is malic acid.

The compounds provide efficacy over a broad pH range in solutions containing a balance of water. This solution's useful pH range extends from at least 2 to 5. In addition, the solution preferably relies upon a balance of deionized water to limit incidental impurities. The pH of the polishing fluid of this invention is preferably from 2.5 to 4.2, more preferably a pH of 2.6 to 3.8. The acids used to adjust the pH of the composition of this invention are, for example, nitric acid, sulfuric acid, hydrochloric acid, phosphoric acid and the like. Exemplary bases used to adjust the pH of the composition of this invention are, for example, ammonium hydroxide and potassium hydroxide.

Further, the polishing composition may optionally contain up to 3 weight percent abrasive to facilitate metal layer removal. Within this range, it is desirable to have the abrasive present in an amount of less than or equal to 1 weight percent. Most preferably, the polishing compositions of the present invention are abrasive free.

The abrasive has an average particle size of less than or equal to 500 nanometers (nm) for preventing excessive metal dishing, dielectric erosion and improving planarization. For purposes of this specification, particle size refers to the average particle size of the abrasive. More preferably, it is desirable to use a colloidal abrasive having an average particle size of less than or equal to 100 nm. Further, decreased dielectric erosion and metal dishing occur with colloidal silica having an average particle size of less than or equal to 70 nm. In addition, the preferred colloidal abrasive may include additives, such as dispersants, surfactants, buffers, and biocides to improve the stability of the colloidal abrasive. One such colloidal abrasive is colloidal silica from Clariant S. A., of Puteaux, France. Also, other abrasives, including, those that are fumed, precipitated, agglomerated, etc., may be utilized.

The polishing composition may include the abrasive for "mechanical" removal of metal interconnect layers. Example abrasives include inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Suitable inorganic hydroxide oxides include, for example, aluminum hydroxide oxide ("boehmite"). Modified forms of these inorganic oxides, such as, organic polymer-coated inorganic oxide particles and inorganic coated particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasives also include polymeric particles, coated polymeric particles, and surfactant stabilized particles. The preferred abrasive, if utilized, is silica.

The composition of the present invention is applicable to any semiconductor wafer containing a conductive metal, such as copper, aluminum, tungsten, platinum, palladium, gold, or iridium; a barrier or liner film, such as tantalum, tantalum nitride, titanium, or titanium nitride; and an underlying dielectric layer. For purposes of the specification, the term dielectric refers to a semi-conducting material of dielectric constant, k, which includes low-k and ultra-low k dielectric materials. The composition and method are excellent for preventing erosion of multiple wafer constituents, for example, porous and nonporous low-k dielectrics, organic and inorganic low-k dielectrics, organic silicate glasses (OSG), fluorosilicate glass (FSG), carbon doped oxide (CDO), tetraethylorthosilicate (TEOS) and a silica derived from TEOS. The compositions of this invention may also be used for ECMP (Electrochemical Mechanical Polishing).

EXAMPLES

To make high molecular weight (~200,000 MW) AA/MAA 2:3 by mole) copolymer use 75 g AA 100% acrylic acid, 135 g MAA 100% methacrylic acid, 0.5 g+1.9 g NaPS $Na_2S_2O_8$, MW=238.1, 270 g+42 g+380 g DI water, 20 g 50% NaOH. 25 g of mixed monomers is charged to a 4-neck 2000 ml reactor followed by 270 g of DI water and 0.5 g of sodium persulfate. The mixture is heated up to 92° C. then the rest of mixed monomers and the solution of 1.9 g of sodium persulfate in 42 g of water are co-fed to the reactor for 40 and 50 minutes. The reaction mixture is held for another 1 hr at 92° C. then let cool to room temperature. GC and GPC of crude product are checked and 10% acid is neutralized by 50% NaOH solution. This procedure gives Mw/Mn=198,000/30,000, AA=532 ppm, MAA=38 ppm, pH=3.7, % solid of the crude product is 45.6%. 20 g of 50% NaOH and 380 g of water is used to dilute crude product to 24.45%, 800 g of crude product is diluted further to 10% solution.

To make a low MW (~27,000) AA/MAA (2:3 by mole) copolymer use 179 g AA (100% acrylic acid), 321 g MAA (100% methacrylic acid), 23.4 g NaPS ($Na_2S_2O_8$), 815 g+110 g DI water, and 49.7 g 50% NaOH solution. 25 g of mixed monomers is charged to a 4-necked 2000 ml reactor followed by 815 g of DI water and 2.4 g of sodium persulfate. The mixture is heated to 95° C. then the rest of mixed monomers and the solution of 21 g of sodium persulfate in 110 g of water are co-fed to the reactor for 140 and 160 minutes, respectively. The reaction mixture is held for another 1 hr at 92° C. then let cool to room temperature. 49.7 g of 50% NaOH is used to neutralize 10% acid. This procedure gives Mw/Mn=30860/6656, AA=0 ppm, MAA=47 ppm, pH=1.2. 49.7 g of 50% NaOH is used to neutralize the crude product to pH=3.6. Final % solids=37.8%.

In the Example all compositions contain, by weight percent, 0.50 BTA, 0.22 malic acid, 0.32 carboxymethylcellulose (CMC), and 9.00 hydrogen peroxide at a pH of 2.8.

The experiment measured copper polishing rates and determined the clearing of residual copper from a semiconductor wafer at a moderate down force pressure. In particular, the test determined the effect of the utilization of modified cellulose compounds in the presence of copolymers of acrylic acid and methacrylic acid on the polishing rate, clear time, and residual copper clearing. Clear time is defined as EPD2-EPD1, where EPD1 is the initial endpoint detection time at which the first sign of barrier layer is detected through the copper layer. EPD2 is the detection time at which the detector sees only barrier layer. FIG. 1 graphically shows this definition of clear time. An Applied Materials, Inc. Mirra 200 mm polishing machine equipped with an ISRM detector system using an IC1010™ polyurethane polishing pad (Rohm and Haas Electronic Materials CMP Inc.) under downforce conditions of about 2 psi (13.8 kPa), a polishing solution flow rate of 150 cc/min, a platen speed of 80 RPM, and a carrier speed of 40 RPM planarized the samples. The polishing solutions had a pH adjusted with nitric acid. All solutions contained deionized water.

amount of 0.1 weight percent provides the best copper removal rate and clearing of residual copper with low dishing. The dishing results are an average of step height ASH results for center and edge position at 90% and 100 um on a 200 mm Sematech 854 mask TEOS wafer. Although some residual copper was found on most samples, the clear times were all less than 30 seconds.

The invention claimed is:

1. A method for polishing of a semiconductor wafer, the semiconductor wafer having copper interconnect metal and residual copper, comprising steps of:

contacting the wafer with a polishing composition, the polishing composition comprising oxidizer, 0 to 1% by weight abrasive, copper inhibitor for the interconnect metal, 0.01 to 15% by weight copper complexing agent, the complexing agent being selected from acetic acid, citric acid, glycolic acid, lactic acid, malic acid, oxalic acid, salicylic acid, succinic acid, tartaric acid, thioglycolic acid, glycine, alanine, aspartic acid, ethylene diamine, trimethyl diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, including salts and mixtures thereof, sodium diethyl dithiocarbamate, ethyl acetoacetate and mixtures thereof, 0.01 to 5% by weight modified cellulose, the modified cellulose having carboxylic acid functionality and a molecular weight between 1K and 250K, 0.01 to 5% by weight copolymer of acrylic acid and methacrylic acid, and balance water, wherein the copolymer of acrylic acid and methacrylic acid has a monomer ratio (acrylic acid/methacrylic acid) in the range of 1:9 to 9:1 and the copolymer has a molecular weight in the range of 1K to 1000K; and clearing residual copper from the wafer with a polishing pad and the modified cellulose and copolymer of the polishing composition without excessive dishing of the copper interconnect metal wherein clearing time for clearing residual copper from the wafer is less than thirty seconds.

2. The method of claim 1 wherein the copolymer of acrylic acid and methacrylic acid has a monomer ratio (acrylic acid/methacrylic acid) of about 2:3.

3. The method of claim 1 wherein the copolymer has a molecular weight in the range of 20K to 200K.

4. The method of claim 1 wherein the modified cellulose is water soluble cellulose modified with carboxylic acid

TABLE 1

| Slurry | aa:maa | Molecular Weight | Conc. Wt % | RR A/min | Residual Clearing | Av. Dishing (A) 90%/100 um | Clear Time EPD2 – EPD1 |
|---|---|---|---|---|---|---|---|
| 1 | 3:2 |  | 0.1 | 2755 | No | 637/463 | 18 |
| 2 | 1:1 |  | 0.1 | 2119 | No | 335/341 | 25 |
| 3 | 2:3 | 22K | 0.05 | 1496 | No | 358/426 | 23 |
| 4 | 2:3 | 27K | 0.1 | 2426 | Yes | 418/397 | 27 |
| 5 | 2:3 | 22K | 0.5 | 1419 | No | 428/411 | 25 |
| 6 | 2:3 | 200K | 0.1 | 3172 | Yes | 642/754 | 19 |
| 7 | 1:4 |  | 0.1 | 1821 | No | 363/457 | 25 |
| 8 | 1:9 |  | 0.1 | 1822 | No | 243/441 | 26 |
| 9 | 0:1 |  | 0.1 | 1640 | No | 305/445 | 21 |

As illustrated in Table 1, the addition of copolymer at a mole ratio of 2:3 acrylic acid to methacrylic acid and at an functionality from the group consisting of carboxy methyl cellulose, agar gum, arabic gum, ghatti gum, karaya gum, guar gum, pectin, locust bean gum, tragacanth gums, tamarind gum, carrageenan gum, and xantham gum, modified starch, alginic acid, mannuronic acid, guluronic acid, and their modifications, copolymers, and mixtures.

5. The method of claim 4 wherein the modified cellulose is carboxy methyl cellulose.

6. The method of claim 1 wherein the composition is abrasive free.

7. A method for polishing of a semiconductor wafer, the semiconductor wafer having copper interconnect metal and residual copper, comprising steps of:

contacting the wafer with a polishing composition, the polishing composition comprising oxidizer, 0 to 1% by weight abrasive, copper inhibitor for the interconnect metal, 0.01 to 15% by weight copper complexing agent, the complexing agent being selected from acetic acid, citric acid, glycolic acid, lactic acid, malic acid, oxalic acid, salicylic acid, succinic acid, tartaric acid, thioglycolic acid, glycine, alanine, aspartic acid, ethylene diamine, trimethyl diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, including salts and mixtures thereof, sodium diethyl dithiocarbamate, ethyl acetoacetate and mixtures thereof, 0.01 to 5% by weight carboxy methyl cellulose and a molecular weight between 1K and 250K, 0.01 to 5% by weight copolymer of acrylic acid and methacrylic acid, and balance water, wherein the copolymer of acrylic acid and methacrylic acid has a monomer ratio (acrylic acid/methacrylic acid) in the range of 1:9 to 9:1 and the copolymer has a molecular weight in the range of 20K to 200K; and clearing residual copper from the wafer with a polishing pad and the carboxy methyl cellulose and copolymer of the polishing composition without excessive dishing of the copper interconnect metal wherein clearing time for clearing residual cooper from the wafer is less than thirty seconds.

8. The method of claim 7 wherein the polishing composition is abrasive free.

9. The method of claim 7 wherein the copolymer of acrylic acid and methacrylic acid has a monomer ratio (acrylic acid/methacrylic acid) of about 2:3.

* * * * *